United States Patent
Kaggie

(10) Patent No.: US 9,472,685 B2
(45) Date of Patent: Oct. 18, 2016

(54) METHODS OF CIRCUIT CONSTRUCTION TO IMPROVE DIODE PERFORMANCE

(71) Applicant: Joshua D. Kaggie, West Jordan, UT (US)

(72) Inventor: Joshua D. Kaggie, West Jordan, UT (US)

( * ) Notice: Subject to any disclaimer, the term of this patent is extended or adjusted under 35 U.S.C. 154(b) by 0 days.

(21) Appl. No.: 14/247,118

(22) Filed: Apr. 7, 2014

(65) Prior Publication Data

US 2014/0300401 A1    Oct. 9, 2014

Related U.S. Application Data

(60) Provisional application No. 61/809,139, filed on Apr. 5, 2013.

(51) Int. Cl.
  *G05F 3/04* (2006.01)
  *H01L 29/861* (2006.01)
  *H03H 7/38* (2006.01)

(52) U.S. Cl.
  CPC .............. *H01L 29/861* (2013.01); *G05F 3/04* (2013.01); *H03H 7/38* (2013.01); *H03H 7/383* (2013.01); *H05K 2201/10174* (2013.01)

(58) Field of Classification Search
  CPC .............. G05F 3/04; H01L 29/6609; H01L 29/66136; H01L 29/861; H05K 2201/10174
  USPC ....... 327/114, 583, 584, 314, 493, 503, 504, 327/505
  See application file for complete search history.

(56) References Cited

U.S. PATENT DOCUMENTS

| | | | | |
|---|---|---|---|---|
| 4,099,228 A | * | 7/1978 | Cohn | H03D 9/0608 330/4.9 |
| 4,952,936 A | * | 8/1990 | Martinson | 342/20 |
| 5,446,923 A | * | 8/1995 | Martinson et al. | 455/330 |
| 5,589,797 A | * | 12/1996 | Gans | H03F 1/3258 330/110 |
| 5,710,653 A | * | 1/1998 | Nemecek et al. | 398/194 |
| 5,782,880 A | * | 7/1998 | Lahtinen et al. | 607/9 |
| 5,789,994 A | * | 8/1998 | Case et al. | 333/20 |
| 6,693,578 B1 | * | 2/2004 | Martinson | 342/20 |
| 8,559,905 B2 | * | 10/2013 | Buer et al. | 455/310 |
| 8,729,809 B2 | * | 5/2014 | Kit et al. | 315/185 R |
| 2005/0221772 A1 | * | 10/2005 | Nakano et al. | 455/114.1 |
| 2008/0246551 A1 | * | 10/2008 | Noujeim | H01P 3/003 333/20 |

* cited by examiner

*Primary Examiner* — William Hernandez
(74) *Attorney, Agent, or Firm* — Geoffrey E. Dobbin; Dobbin IP Law

(57) ABSTRACT

The present invention is a method by which diodes are connecting in a circuit such that they are more robust. The method involves placing two diodes of opposite directions in parallel and applying a DC bias such that a forward diode may then handle higher than normal voltages and a reverse diode provides a failsafe in the event of a reverse bias.

14 Claims, 14 Drawing Sheets

METHODS OF CIRCUIT CONSTRUCTION TO IMPROVE DIODE PERFORMANCE

CROSS-REFERENCES TO RELATED APPLICATIONS

This Application claims priority as a non-provisional perfection of prior filed U.S. Provisional Application No. 61/809,139, filed Apr. 5, 2013, and incorporates the same by reference herein in its entirety.

FIELD OF THE INVENTION

The present invention relates to the field of electronic circuitry and more particularly relates to a method by which the performance of diodes may be improved, in particular for use in imaging applications like magnetic resonance imaging.

BACKGROUND OF THE INVENTION

An accurate understanding of diode properties can help improve circuitry that involves diodes. Appropriate circuitry can improve the functionality of coils, make circuits more robust to high voltages, and reduce construction time. An unbiased reverse diode pair (RDP) can tolerate high voltage RF waves but will introduce distortion and high resistance to RF waves; and, a forward-biased (FB) diode has negligible distortion of RF waves and can handle very high voltage RF waves without diode breakdown, but is very susceptible to breakdown when unbiased. Both methods have been successfully used separately in transmit and receive coil decoupling circuits, as well as with many other circuits, including transmit-receive (TR) switches and multi-tuned coils.

An important feature of PIN diodes is their ability to remain forward-biased with large RF signals and small DC bias current. The maximum RF current that the diode can control depends on the amount of stored charge supplied by the DC forward-bias relative to the charge variations produced by the RF signal. When a diode is forward-biased with current IF, the I-region has a stored charge of $Q=I_{DC}\tau$, where $\tau$ is the recombination time or carrier lifetime. The diode's resistance is inversely proportional to Q. The charge, q, introduced by RF during a half cycle is $q=I_{RF}/\pi f$. In order for the diode to remain on, Q must remain greater than q, or, in another form, $I_{DC}\tau > I_{RF}/\pi f$. This theory predicts that a diode with 100 mA of DC current, a carrier lifetime of 1.0 µs, can handle a 100 MHz wave with current up to 30 A. PIN diode RF capabilities can be greater than 2000V and 25 A. Leenov (The silicon PIN diode as a microwave radar protector at megawatt levels. (Electron Devices, IEEE Transactions on 1964; 11(2):53-61)) tested PIN diodes biased with 100 mA of current, using 2.5 µs pulse length at 9.0 GHz, with 70 kW of power, and predicted and experimentally verified that a PIN diode can handle 38 megawatts of power for 1 µs, and tens of kilowatts continuously.

The present invention is a methodology utilizing a forward-biased reverse diode pair (FB-RDP) which has negligible RF distortion, very high RF voltage tolerance, low resistance to RF, and is not as susceptible to breakdown when unbiased. A FB-RDP can be implemented in most instances where there is a single diode, improving the robustness of the circuit.

The present invention represents a departure from the prior art in that the methodology of the present invention allows for a more robust construction of electronic circuits using readily available components while simultaneously reducing RF distortion.

SUMMARY OF THE INVENTION

In view of the foregoing disadvantages inherent in the known types of circuits, this invention provides an improved circuit construction. As such, the present invention's general purpose is to provide a new and improved circuit construction that is more robust in its use of diodes while providing reduced RF distortion.

To accomplish these objectives, the method of circuit construction comprises utilizing a reverse-diode pair that has been forward biased by a DC current in place of single diodes, forward biased single diodes and unbiased reverse diode pairs.

The more important features of the invention have thus been outlined in order that the more detailed description that follows may be better understood and in order that the present contribution to the art may better be appreciated. Additional features of the invention will be described hereinafter and will form the subject matter of the claims that follow.

Many objects of this invention will appear from the following description and appended claims, reference being made to the accompanying drawings forming a part of this specification wherein like reference characters designate corresponding parts in the several views.

Before explaining at least one embodiment of the invention in detail, it is to be understood that the invention is not limited in its application to the details of construction and the arrangements of the components set forth in the following description or illustrated in the drawings. The invention is capable of other embodiments and of being practiced and carried out in various ways. Also it is to be understood that the phraseology and terminology employed herein are for the purpose of description and should not be regarded as limiting.

As such, those skilled in the art will appreciate that the conception, upon which this disclosure is based, may readily be utilized as a basis for the designing of other structures, methods and systems for carrying out the several purposes of the present invention. It is important, therefore, that the claims be regarded as including such equivalent constructions insofar as they do not depart from the spirit and scope of the present invention.

DETAILED DESCRIPTION OF THE PREFERRED EMBODIMENT

With reference now to the drawings, the preferred embodiment of the methodology is herein described. It should be noted that the articles "a", "an", and "the", as used in this specification, include plural referents unless the content clearly dictates otherwise.

Figure 1:
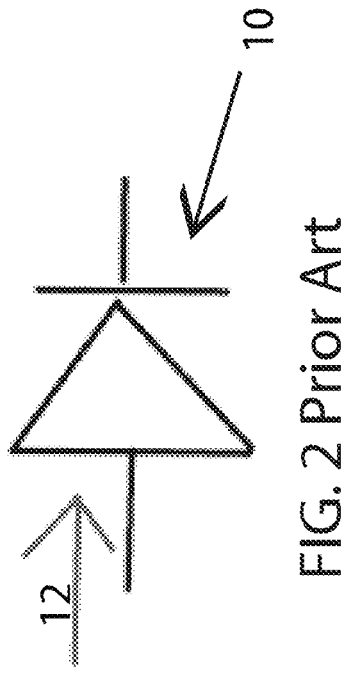
FIG. 1 is a circuit diagram of a prior art diode.

With reference to FIG. 1, a prior art diode 10 is presented. As stated before, diodes are useful components for modern circuits and transistors, but they have limitations. Diodes are limited in the power they can allow to pass through them. Diodes break with too much reverse bias, tend to generate destructive heat, and are sensitive to physical shock. All of these limitations affect the speed, power, size and ultimate performance of modern electronic components.

Figure 2:
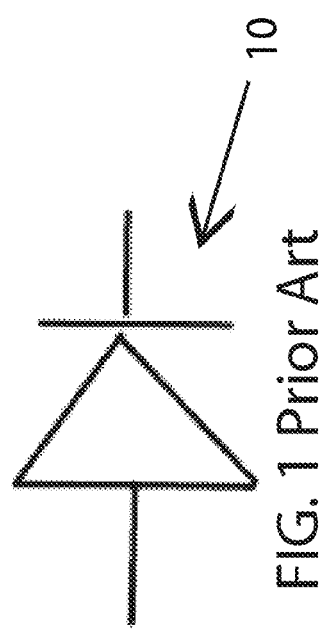
FIG. 2 is a circuit diagram of a prior art forward-biased diode.
Figure 3:
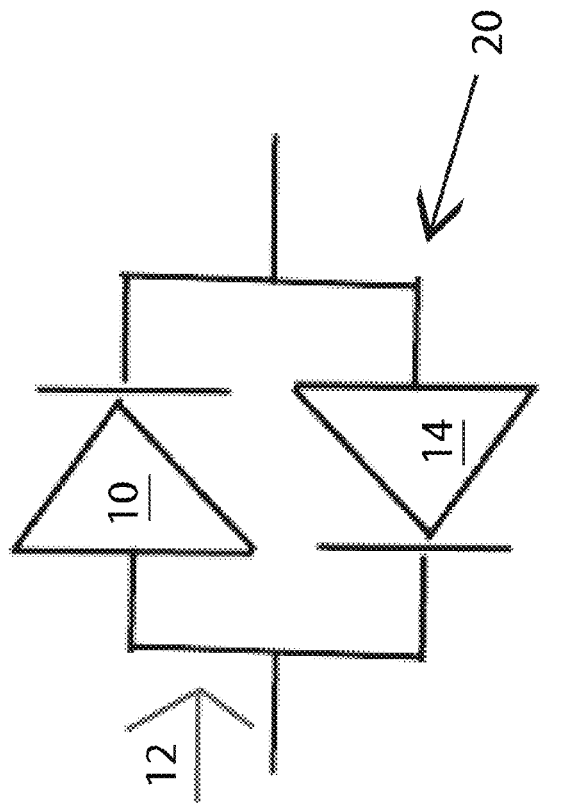
FIG. 3 is a circuit diagram of a prior art reverse diode pair.

Prior art efforts to make a more robust diode construction are shown in FIGS. 2 and 3. In FIG. 2, a forward DC bias 12 is shown operating through the diode 10. This tends to reduce the overall capacitance and resistance of the diode and improve performance by reducing heat and raising the power the diode can handle. However, if the DC bias is removed, the diode easily breaks. Another solution is shown in FIG. 3, a reverse diode pair ("RDP") 16. In place of a single diode 10, a second, reversed direction diode 14 is placed in parallel with the original diode. This construction handles reverse biases better than the original diode alone, therefore making it more robust. However, this construction also increases resistance (increasing heat) and tends to distort low power waveforms.

Figure 4:
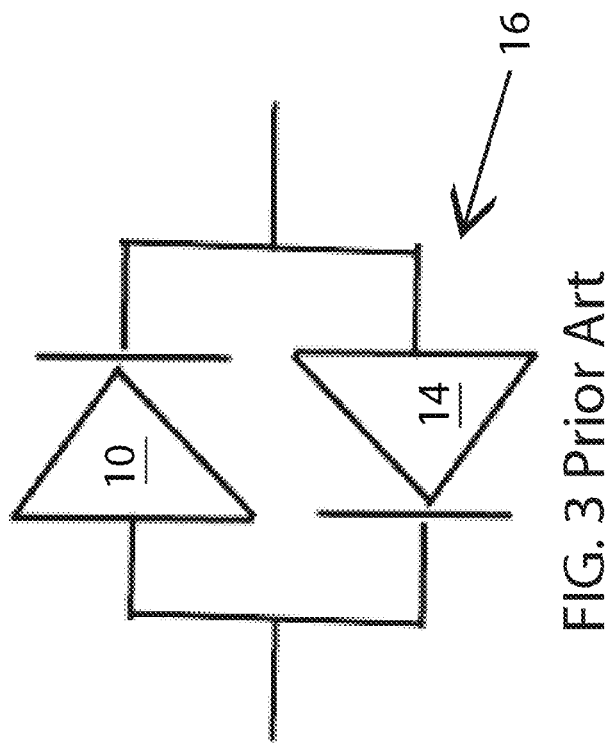
FIG. 4 is a circuit diagram of the present invention, a forward-biased reverse diode pair.
Figure 5:
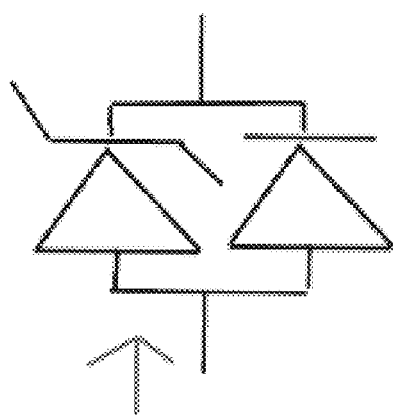
FIG. 5 is a circuit diagram of the present invention crossed with inductors and capacitors for use with radio frequencies.
Figure 6:
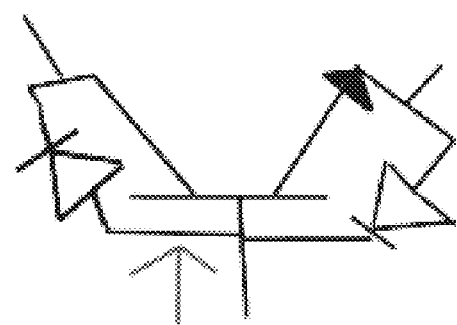
FIG. 6 is a circuit diagram of the present invention utilizing a zener diode.
Figure 8:
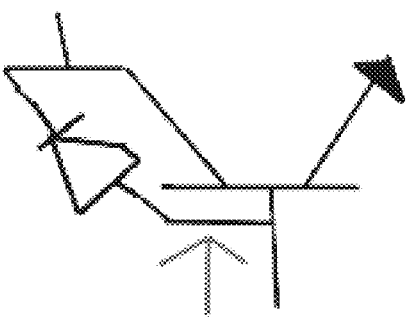
FIG. 8 is a circuit diagram of the present invention utilized in a second transistor.
Figure 7:
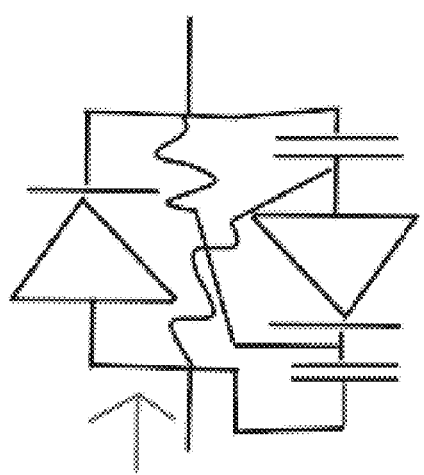
FIG. 7 is a circuit diagram of the present invention utilized in a transistor.
Figure 9:
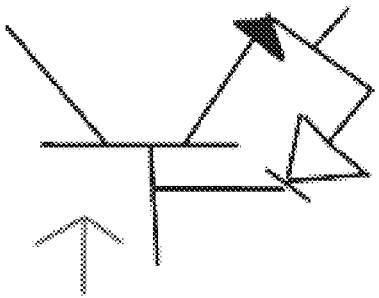
FIG. 9 is a circuit diagram of the present invention utilized in both branches of a third transistor.

The present invention 20 is placing a forward bias on a reverse diode pair ("FB-RDP"), shown in FIG. 4. This combination of techniques has not been practiced in the prior art and combines the benefits of both prior art techniques while simultaneously eliminates their deficiencies. The methodology may be practiced in many circuits and the reverse diode does not have to have the same characteristics as the forward diode. As such, the method may be practiced in a D/L/C circuit (FIG. 5), with a zener diode (FIG. 6) and in transistors (FIGS. 7-9). In all three cases, the circuits may handle higher voltages. In the case of the transistor constructions, higher voltage can be translated into higher switching speeds.

Figure 10:
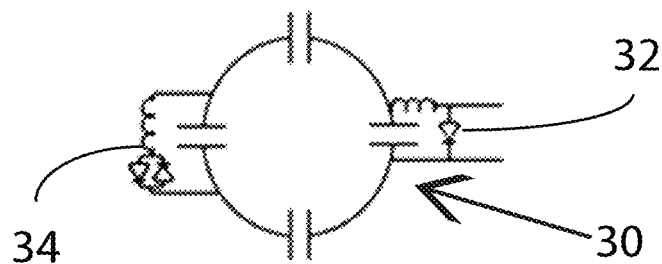
FIGS. 10-21 are circuit diagrams of various coil configurations for use in radio frequency scanning, FIGS. 10, 19 and 20 being prior art.

Further application may be found in radio transmit and receive coils, such as is found in Magnetic Resonance Imaging (MRI). RF receive coils 30 typically contain two diode circuits: an active decoupling circuit 32 which contains a diode and inductor in parallel with a capacitor, with the diode being forward biased during RF transmission; and, a passive decoupling circuit 34 which contains an unbiased RDP and inductor in parallel with a capacitor, activating only if the active decoupling circuit doesn't perform properly—which could occur if the active decoupling circuit diode has undergone breakdown (FIG. 10). Decoupling circuits create a high impedance when the diodes are activated (such as when forward-biased), thereby detuning the coil. Using a FB-RDP, both active and passive decoupling circuits can be combined into one circuit 20 (FIG. 11), giving many advantages over two separate circuits: 1) by using only one decoupling circuit, fewer circuit elements require construction and testing and reduce their ability to affect the quality ("Q") of the coil; 2) by eliminating diodes that act in only one direction, the diodes can tolerate significantly higher voltages, significantly reducing the chance that they have permanent breakdown; 3) by reducing the number of circuits, less physical space is required for coil circuitry; and, 4) by removing the passive decoupling circuits, fewer tuning capacitors are required on the coil (since passive decoupling requires capacitors to block DC from activating the crossed diodes in the coil, which can potentially improve the Q of the coil and improve the decoupling effectiveness.

Figure 11:
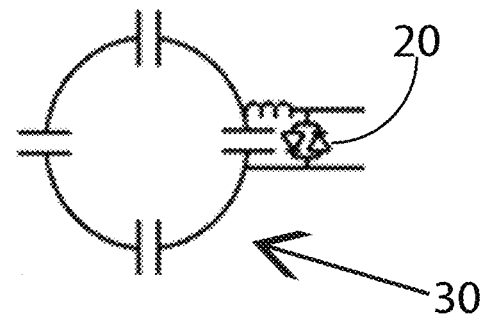
Figure 12:
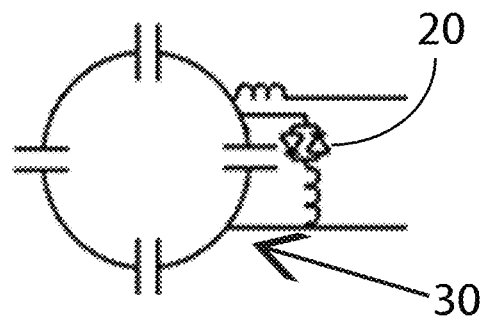
Figure 13:
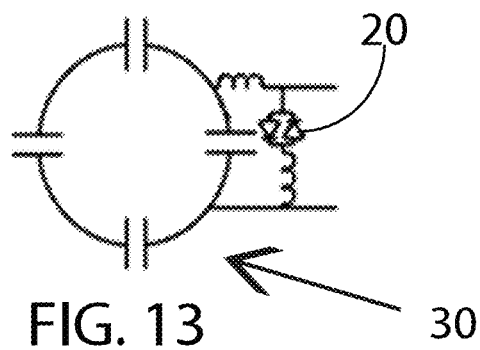
Figure 14:
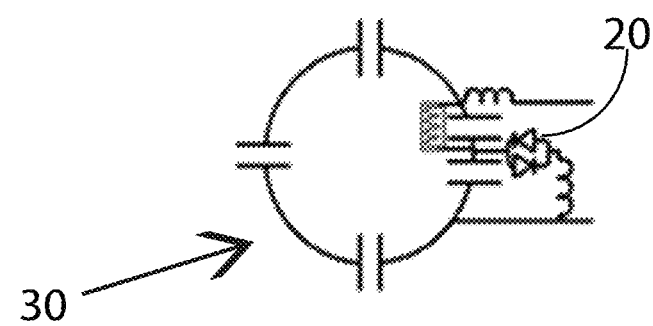
Figure 15:
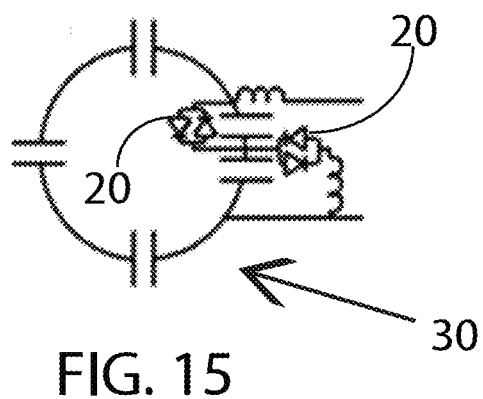
Figure 16:
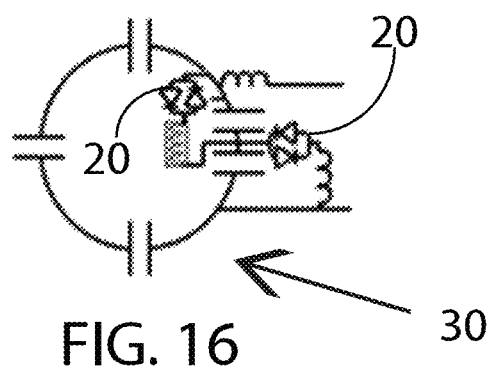
Figure 17:
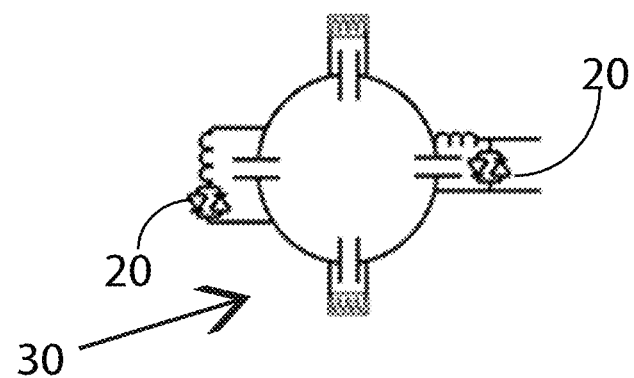
Figure 18:
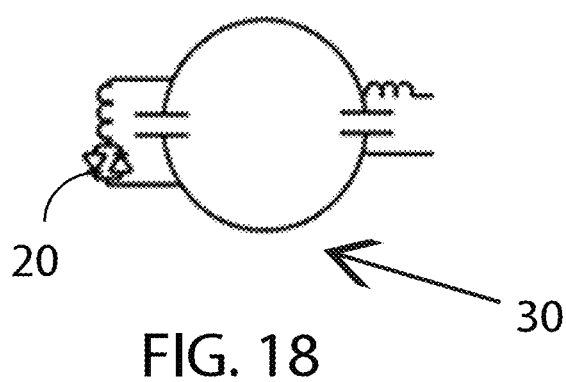

The combined active/passive decoupling can be placed at different positions on the coil, as shown in FIGS. 11-21. While there are many variations on match circuitry possible, a few circuits are illustrated to introduce some techniques. The decoupling circuit can be placed shunt with the match capacitor and match inductor using a FB-RDP 20 (FIG. 11). To reduce decoupling circuit dependency on both the match capacitor and inductor, a separate resonant inductor can be placed in series with the FB-RDP 20 (FIG. 12, 13). Decoupling strength will often be greatly improved if the decoupling circuit is placed over a tuning capacitor because the tuning capacitor is typically lower than the match capacitor. The improved decoupling strength is due to the improved Q of the trap. Although an ideal trap with zero real resistance will have infinite decoupling with any capacitor that is resonant with its respective inductor, the addition of impedance from the diode reduces decoupling strength. By using a reduced capacitor value, the inductor value increases and the Q of the trap improves. In FIG. 14, the decoupling circuit is placed in shunt with a tuning capacitor. The DC bias can also pass through a FB-RDP or an RF choke and FB-RDP (FIGS. 15, 16). The DC bias can also pass around the coil as shown in FIGS. 17, 18. Passing the DC bias throughout the entire coil is not recommended for sequences that require a homogeneous flip angle because the DC bias can alter the magnetic field. FIG. 18 is shown to illustrate an effective but simple coil. FIG. 17 is a method that is comparable to the traditional receive coil (FIG. 10), except both decoupling circuits contain a RDP and are activated during transmit. Using combined active/passive decoupling, multiple decoupling circuits can also be combined to decouple a coil at more than one frequency (FIG. 17).

Figure 20:
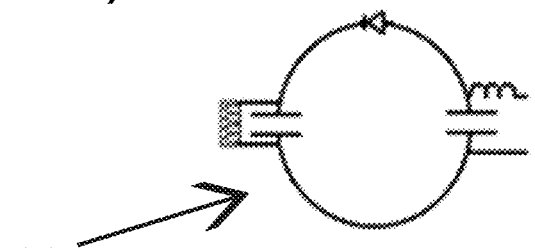
Figure 21:
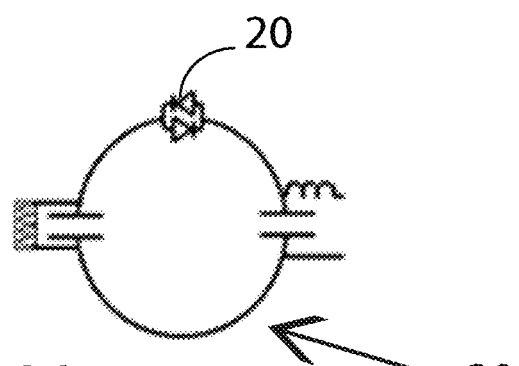

Serial diodes can provide broadband decoupling and can be used in both or either transmit or receive mode (FIGS. 20, 21). The illustration in FIG. 21 replaces a single diode with a RDP, allowing increased protection against diode breakdown. The diodes present a high resistance when unbiased and a low resistance when biased. PIN diodes are more ideal when compared to other types of diodes, because they have a higher unbiased resistance and a lower biased resistance (however, their switching times are typically 100× longer than PN diodes). If the coil is intended for receive only, multiple diodes in parallel with each other and higher current can be used (often by combining DC bias lines) to reduce resistive losses. If the coil is intended for transmit only then diodes can be used at multiple positions of the coil to improve decoupling. While placing diodes at more than one position will decrease the Q of the resonant coil, decreased Q is less significant for a transmit-only coil since increased power can be often used during transmit.

Whenever diodes require a forward-bias, RF chokes can be added to create a path for the DC current to pass to from the DC bias line to ground. To avoid biasing the crossed diodes with the negative DC bias, a single diode is added into the bias line so that only positive DC current or no current is supplied to the loops. By eliminating the negative DC voltage, the crossed diodes are not activated during receive.

Figure 19:
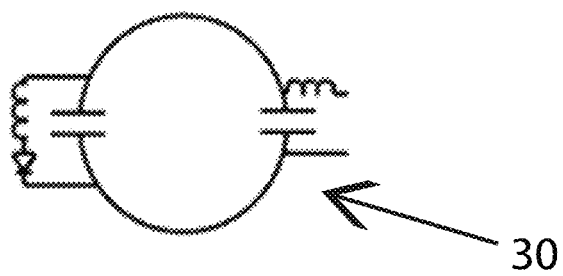

RF transmit coils typically use active decoupling circuits for detuning, similar to RF receive coils. These decoupling circuits require large negative voltages to prevent accidental detuning of the transmit coil, which occurs when the high transmit RF voltages activate the diodes. Typical transmit coils use decoupling circuits similar to receive coils (FIG. 19). These decoupling circuits require diodes that can tolerate high RF power and a large negative DC voltages, making it difficult to implement new or more complicated transmit coils. A transmit coil decoupling technique that uses low DC biasing currents/voltages can improve the availability of custom transmit coils. Smaller custom transmit coils reduce the SAR that the patient experiences, which can improve the parameters of many pulse sequences and reduce tissue heating. Custom transmit coils are necessary on most scanners for non-proton MRI. Using less power intensive decoupling techniques might also allow more complicated transmit arrays, which are necessary for transmit coils used at fields strength at and above 7 T. There are many low voltage methods to detune transmit coils, however they can be difficult to implement and can degrade coil quality.

Serial RDP's without any forward-biasing have been used for decoupling volume coils. The RDP's activate due to high RF transmit voltages. This method has significant disadvantages: the RDP's can distort the waveform at low RF transmit voltages; if there are multiple RDP's in the coil, such as on separate birdcage rungs, not all RDP's will be activated since current travels through the least resistive path which may not be through diodes that are inactive and have a high resistance. It is essential that forward-biasing current must be used when multiple RDP's are used on a volume coil so that each RDP presents the same resistance to the RF waveform, otherwise the coil will have less predictable behavior.

Success has been demonstrated using serial forward diodes to tune transmit coils when forward-biased (with >20 mA) and detune them when unbiased. Diodes with low reverse breakdown voltages that use small forward-biasing currents provide adequate tuning (and decoupling), even with large RF voltages. For comparison, the SIEMENS body RF coil uses −440 V when tuned (during transmit or receive) and 5000 mA when detuned (when separate coils are operational) which is significantly more than >20 mA to create a tuned/detuned coil. The serial diode method is counter-intuitive, since a forward-biased diode seems voltage limited before deactivating under high RF power, which does not occur. The serial FB-RDP method is simple and straight-forward, doesn't distort RF waveforms, can tolerate very high voltages, can use inexpensive diodes, can provide broadband decoupling, and is excellent at decoupling coils when unbiased. By preventing diode breakdown, the coil will require fewer repairs (if any) after incorrect biasing, which can occur during research, experimentation, negligence, and other hardware failures. There are disadvantages as well: forward-biased diodes have higher resistance than copper, which can reduce the Q of the coils; and, unbiased diodes will break down when there are large negative RF or DC voltages. These disadvantages can be overcome by various techniques. Multiple parallel diodes and increased DC current through the diodes will reduce diode resistance which can improve the Q of the coil. If the coil requires improved decoupling, multiple serial FB-RDP's can be used at different locations on the coil.

Other transmit coils that use single forward diodes can benefit from using FB-RDP's, such as dual-resonant coils that use forward-diodes and capacitors in parallel with tuning capacitors, changing the resonance of the coil between the activated/deactivated diode states. By using FB-RDP's, the coils would be more robust against breakdown.

Figure 22:
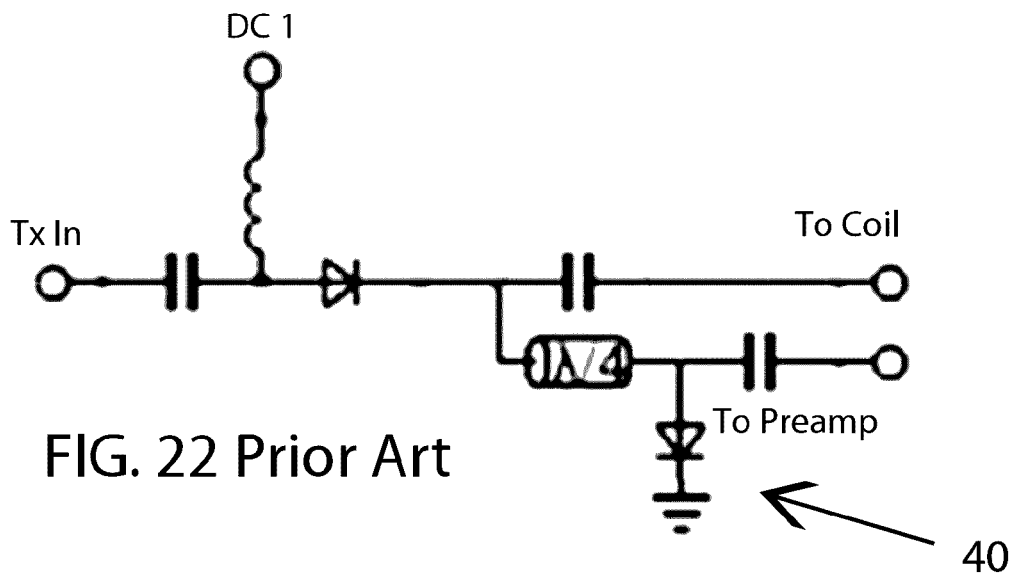
FIGS. 22-27 are circuit diagrams of various TR switches, FIGS. 22, 24 and 26 being prior art.
Figure 23:
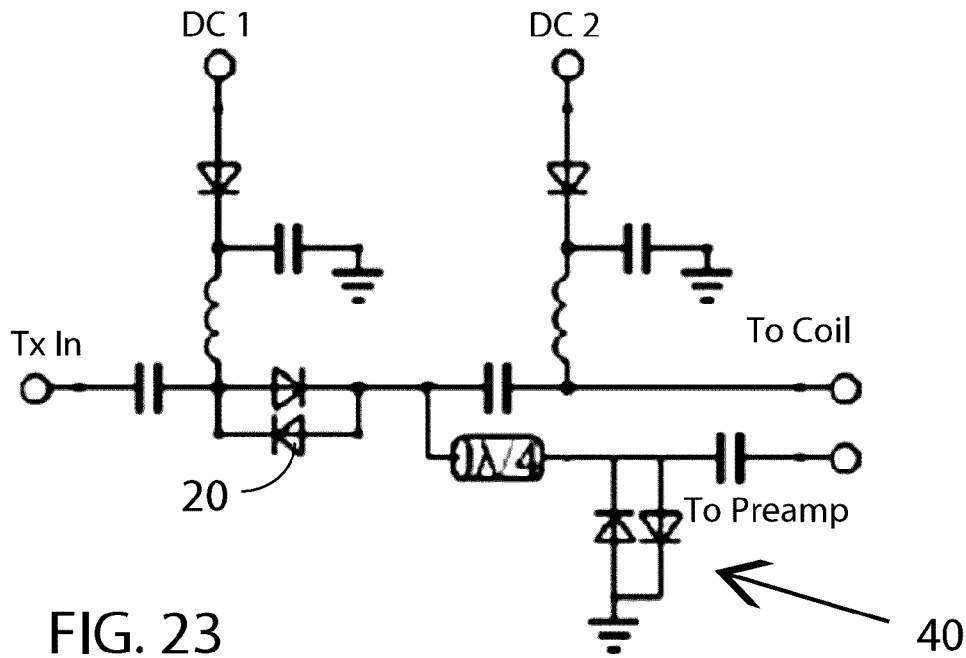
Figure 24:
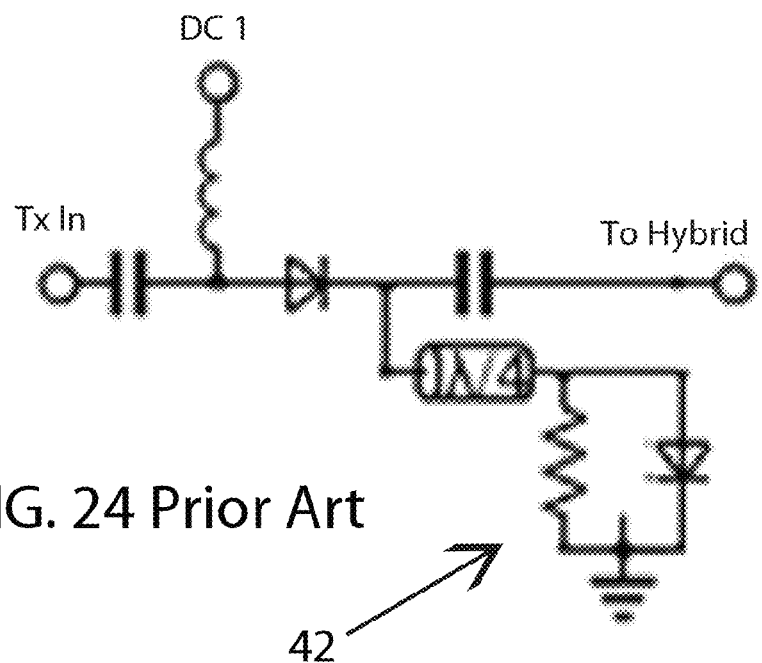
Figure 25:
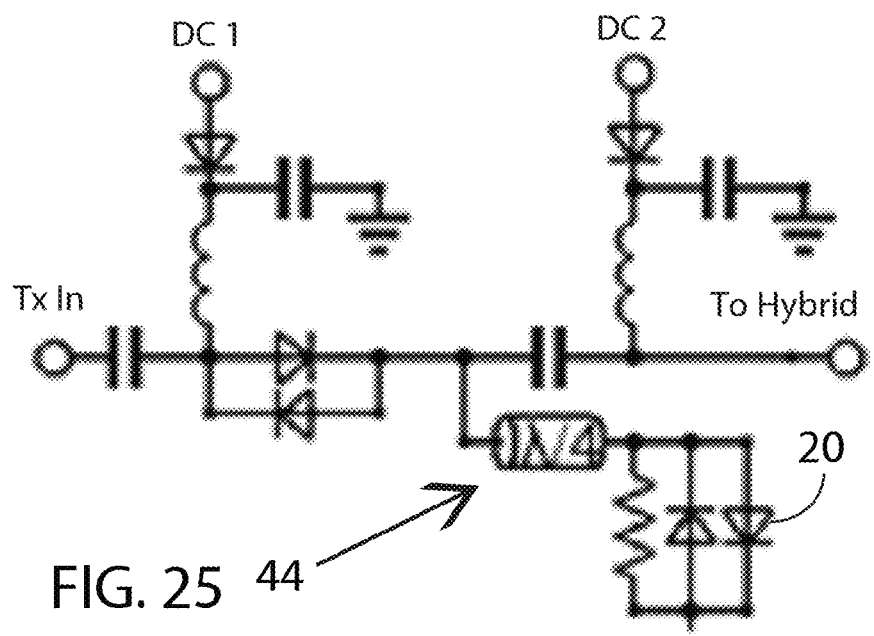
Figure 26:
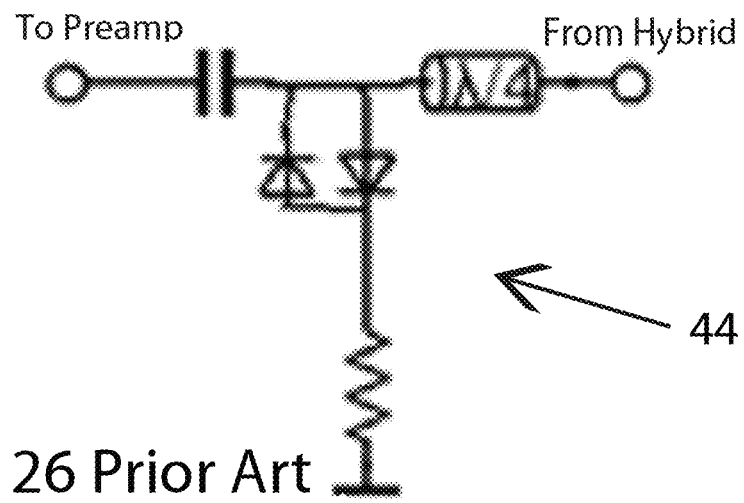
Figure 27:
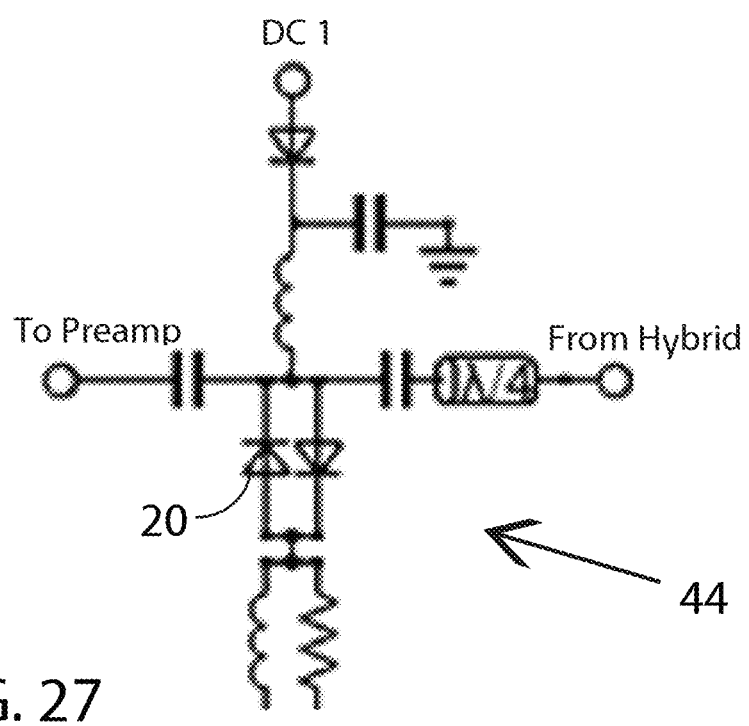

A TR switch can be modified when compared to a standard TR switch, to allow the transmit coil to be biased when necessary and to take advantage of the FB-RDP. A standard, prior art, linear mode TR switch 40 is shown in FIG. 22 while a linear mode TR switch with diodes replaced with crossed diode pairs is shown in FIG. 23. The DC bias lines use a diode to remove the reverse-bias voltage. DC1 is forward-biased when the TR switch is in transmit mode and reverse-biased when the TR switch is in receive mode. DC2 controls the coil independent from DC1 so that the coil can be used in either transmit or receive mode. FIGS. 24 and 26 depict standard, prior art, quadrature TR switches 42, 44. A quadrature TR switch is used for many volume coils, such as birdcage coils, to transmit and receive from the 0 and 90 degree ports. FIGS. 25 and 27 show improved quadrature TR switches, with forward biased cross-diode pairs for improved high-voltage RF protection.

In testing, a single forward diode was placed on DC bias lines to remove the negative voltages supplied by the scanner, so that RDP's were either unbiased or forward-biased. A 15000 pF capacitor was placed between the diode and the inductive choke so that any excess RF went to ground, preventing the forward diode from high voltages. The forward diodes that are normally on a TR switch were replaced with FB-RDP's, which will allow the TR switch to function if not properly biased. An extra DC bias line was added between the TR switch and the coil so that the coil was independent from the TR switch, allowing the coil to be tuned either during receive or transmit.

An additional DC bias line and RF choke should be added to the quadrature TR switch, so that the RDP is always active during transmit, instead of relying on high RF powers for activation, providing greater protection to the preamp (FIG. 27). An RF choke is placed in parallel with the resistor so that the DC paths through all diodes see the same resistance, ensuring that all diodes are turned on (FIG. 27).

Figure 28:
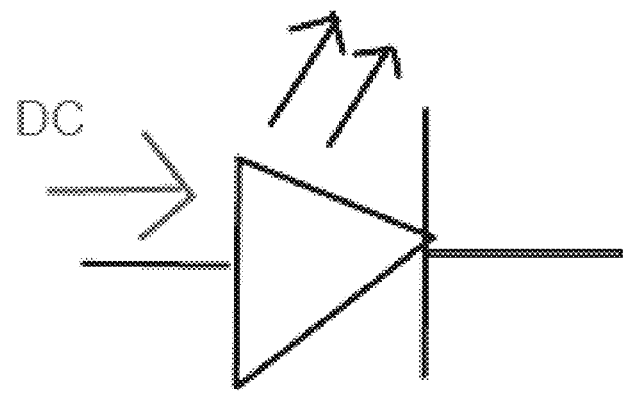
FIG. 28 is a circuit diagram of a prior art LED.
Figure 29:
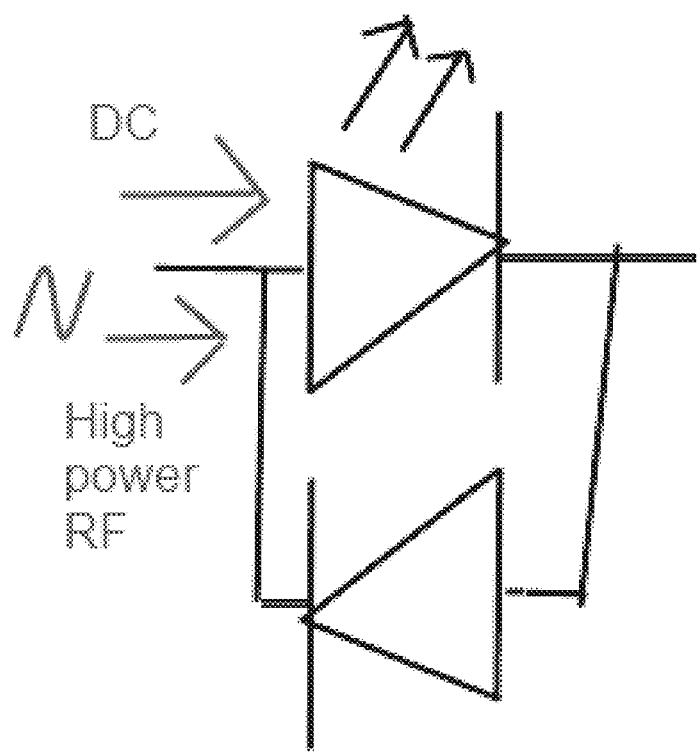
FIG. 29 is a circuit diagram of the present invention utilized with an LED.

The present invention may also be readily utilized with Light Emitting Diodes (LEDs) as the reverse diode does not have to have the same characteristics as the forward diode. FIG. 28 show a prior art LED while FIG. 29 depicts a LED coupled with a reverse diode. The forward DC bias allows for the LED to handle a higher powered RF current while the reverse diode provides protection to the LED, resulting in a more stable and durable LED construction that does not generate as much heat, which has proven detrimental to prior art LEDs. The use of the FB-RDP may also allow for greater light output as light output is determined primarily by the input voltage and current to an LED.

Figure 30:
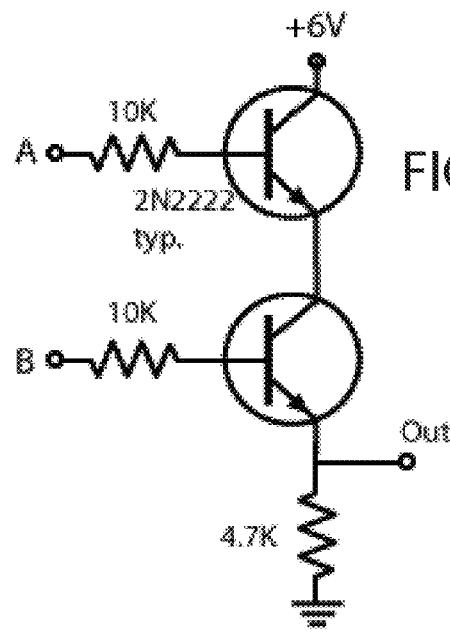
FIG. 30 is a circuit diagram of a prior art NPN AND gate.
Figure 31:
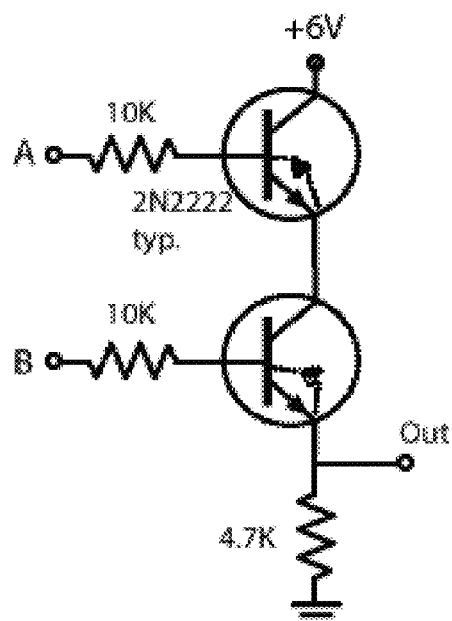
FIG. 31 is a circuit diagram of a prior art NPN AND gate with overvoltage protection in the form of reverse diode pairs.
Figure 32:
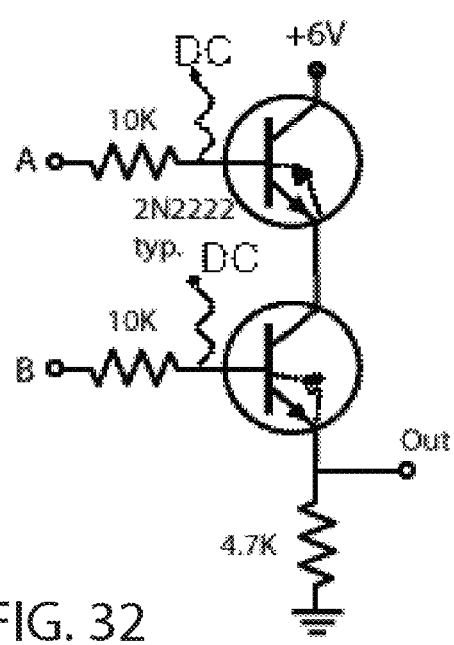
FIG. 32 is a circuit diagram of an NPN AND gate utilizing the present invention.
Figure 33:
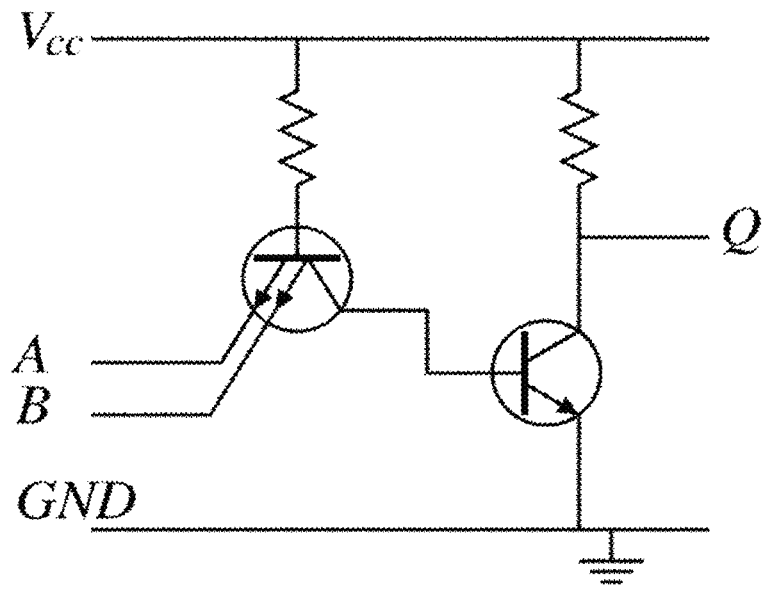
FIG. 33 is a circuit diagram of a prior art NPN NAND gate
Figure 34:
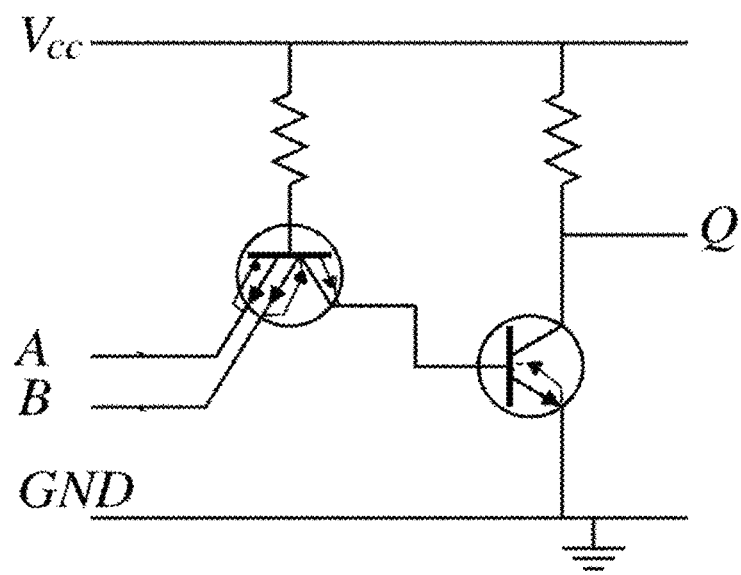
FIG. 34 is a circuit diagram of a prior art NPN NAND gate with overvoltage protection in the form of reverse diode pairs.
Figure 35:
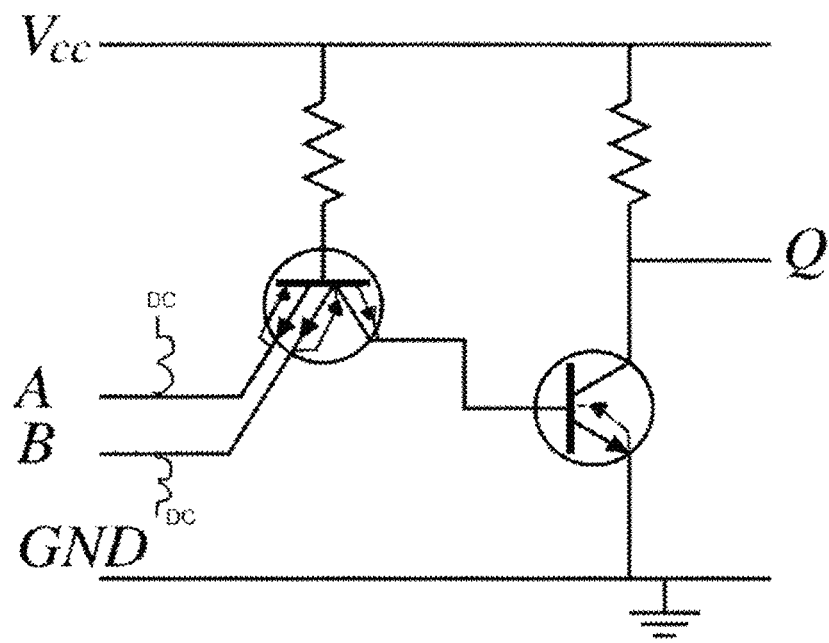
FIG. 35 is a circuit diagram of an NPN NAND gate utilizing the present invention.
Figure 36:
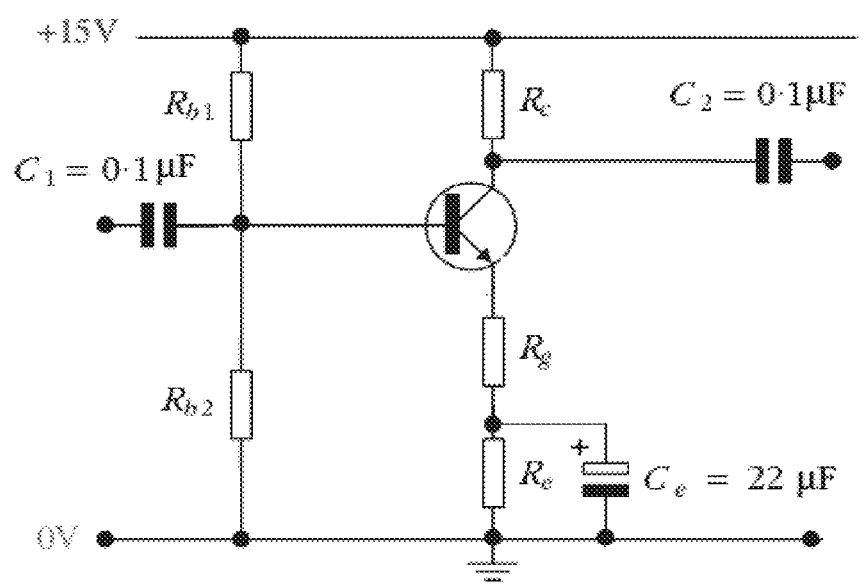
FIG. 36 is a circuit diagram of a prior art transistor amplifier.
Figure 37:
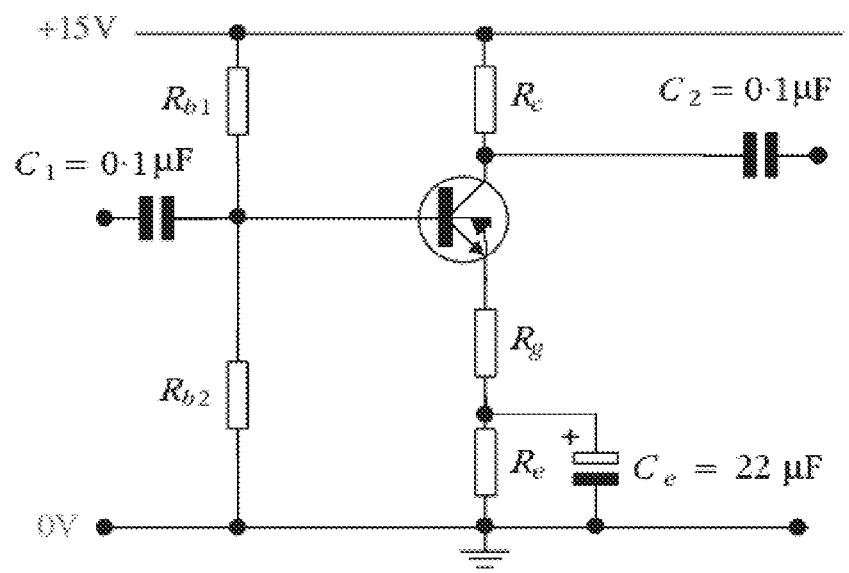
FIG. 37 is a circuit diagram of a transistor amplifier utilizing the present invention.

The present invention may also be utilized to vastly improve transistor performance, as shown in FIGS. 30-38. In FIGS. 30-32, transistors are utilized in an AND gate, with FIGS. 30 and 31 depicting prior art. The addition of a DC bias to a reverse diode pair, as shown in FIG. 32, increases the potential input voltages that the gate may handle, thus making it faster. Likewise the NAND gate, shown in FIGS. 33-35, will also show increased performance values. This is also true of the transistor amplifier, FIGS. 36 and 37, where a DC bias is already applied in the prior art shown in FIG. 36, but the reverse diode pair is added in FIG. 37.

It should be noted that the addition of a reverse diode does not change the circuit as all forward current flows through the forward diode. The reverse diode merely is there to make the diode system more stable. Likewise, the addition of a DC bias does not change the circuit; it merely "primes" the forward diode so that it may handle higher current and voltage values. The increased ability coupled with the increased durability allows for greater power to flow though the circuit and increases efficiency dramatically and ultimately allows for more simple circuit constructions. In the tests run by the inventor with an MRI array, signal to noise ratio (SNR) was improved by 2-5× by utilizing these techniques to improve and simplify transmit and receive coils. This improvement in SNR translates into a 4-25× decrease in scan time for a given resolution and other scan parameters, thus allowing for a scan for harder to image isotopes to become much more feasible with correspondingly better image results.

Figure 38:
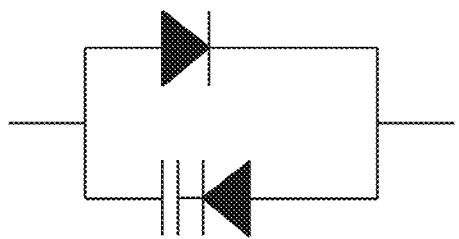
FIG. 38 is a circuit diagram of a forward biased reverse diode pair with a DC blocking capacitor in series with the reverse diode.
Figure 40:
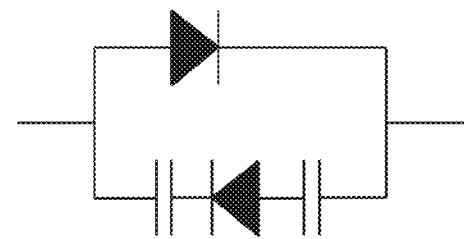
FIG. 40 is a circuit diagram of a forward biased reverse diode pair with two DC blocking capacitors in series with the reverse diode.
Figure 39:
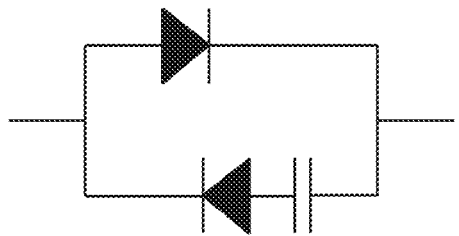
FIG. 39 is another circuit diagram of a forward biased reverse diode pair with a DC blocking capacitor in series with the reverse diode.
Figure 41:
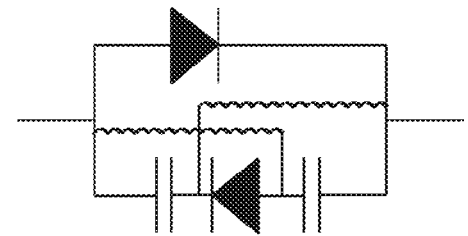
FIG. 41 is a circuit diagram of a forward biased reverse diode pair with two DC blocking capacitors in series with the reverse diode and both diodes being simultaneously biased.

Additional improvements may be had as in the addition of DC blocking capacitors, as shown in FIGS. 38-41. The addition of DC blocking capacitors around the reverse diode, as shown in FIGS. 38-40 allows the circuit to behave similarly to a single diode for low voltage RF waves when biased either negatively or positively and for high voltage RF wave when positively biased. The addition of the bias lines in FIG. 41 allows for both diodes to be simultaneously biased either forwards or reversed and adds protection from diode breakdown caused by high RF voltages. Either of these circuits could be utilized to allow transmit coils in radiography apparatuses serve dually as receive coils.

Although the present invention has been described with reference to preferred embodiments, numerous modifications and variations can be made and still the result will come within the scope of the invention. No limitation with respect to the specific embodiments disclosed herein is intended or should be inferred.

What is claimed is:

1. A method of utilizing diodes in an electrical circuit, the method comprising:
   a. coupling two diodes in parallel into a circuit, one being a forward diode while another being a reverse diode;
   b. applying a DC bias current to the circuit such that the DC bias current flows through the forward diode; and
   c. applying an RF wave to the circuit such that the RF wave passes through the forward diode and experiences no distortion therefrom, the forward diode constantly conducting the RF wave with low impedance.

2. The method of claim 1, the forward and reverse diodes having different characteristics.

3. The method of claim 1, the forward diode being a light emitting diode.

4. The method of claim 1, the forward diode being a zener diode.

5. The method of claim 1, the circuit being a crossed D/L/C circuit.

6. The method of claim 1, the diodes being utilized in a transistor.

7. The method of claim 1, the diodes being utilized in an RF transmit coil.

8. The method of claim 1, the diodes being utilized in an RF transceive coil.

9. The method of claim 1, the diodes being utilized in an RF receive coil.

10. The method of claim 1, the diodes being utilized in a transmit/receive switch.

11. An electrical circuit for handling an RF waveform, the circuit comprising a reverse diode pair and having a forward DC bias current passing through a forward diode of the reverse diode pair, the reverse diode pair not distorting the RF waveform passing therethrough and the forward diode constantly conducting the RF wave with low impedance.

12. The electrical circuit of claim 11, the forward diode and a reverse diode in the reverse diode pair having different characteristics.

13. The electrical circuit of claim 11, the forward diode being a light emitting diode.

14. The electrical circuit of claim 11, the forward diode being a zener diode.

* * * * *